(12) United States Patent
Nagayama et al.

(10) Patent No.: US 10,566,175 B2
(45) Date of Patent: Feb. 18, 2020

(54) FOCUS RING AND PLASMA PROCESSING APPARATUS

(71) Applicant: TOKYO ELECTRON LIMITED, Tokyo (JP)

(72) Inventors: Nobuyuki Nagayama, Miyagi (JP); Naoyuki Satoh, Miyagi (JP); Masahiko Oka, Kumamoto (JP); Yasuyuki Matsuoka, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/945,456

(22) Filed: Apr. 4, 2018

(65) Prior Publication Data

US 2018/0240651 A1 Aug. 23, 2018

Related U.S. Application Data

(62) Division of application No. 14/524,049, filed on Oct. 27, 2014, now abandoned.

(30) Foreign Application Priority Data

Oct. 25, 2013 (JP) .................. 2013-222563

(51) Int. Cl.
*C08L 27/16* (2006.01)
*H01J 37/32* (2006.01)

(52) U.S. Cl.
CPC .. *H01J 37/32642* (2013.01); *H01J 37/32091* (2013.01); *C08L 27/16* (2013.01)

(58) Field of Classification Search
CPC ............... H01J 37/32642; C08L 27/16
(Continued)

(56) References Cited

U.S. PATENT DOCUMENTS 3,695,790 A * 10/1972 Jones ............... F01C 19/10
418/149
4,438,957 A * 3/1984 Williams ............ B63B 27/24
277/540

(Continued)

FOREIGN PATENT DOCUMENTS

| JP | 2007-12911 A | 1/2007 |
| JP | 2008-244096 A | 10/2008 |
| JP | 2012-9563 A | 1/2012 |

*Primary Examiner* — Scott W Dodds
(74) *Attorney, Agent, or Firm* — Rothwell, Figg, Ernst & Manbeck, P.C.

(57) ABSTRACT

A focus ring to be detachably attached to a top surface of an outer peripheral portion of a mounting table in a processing chamber, includes: an annular main body having a back surface to be attached to the top surface of the outer peripheral portion of the mounting table. And a thermally conductive sheet fixed to the annular main body, the thermally conductive sheet being interposed between the annular main body and the top surface of the outer peripheral portion of the mounting. The thermally conductive sheet is fixed as one unit to the annular main body by coating an unvulcanized rubber on one surface of the thermally conductive sheet, bringing said one surface into contact with the annular main body, and heating the thermally conductive sheet and the annular main body to vulcanize and to adhere the thermally conductive sheet to the annular main body.

1 Claim, 5 Drawing Sheets

(58) Field of Classification Search
USPC .......................................................... 427/387
See application file for complete search history.

(56) References Cited

U.S. PATENT DOCUMENTS

| | | |
|---|---|---|
| 2002/0058743 A1 | 5/2002 | Tobita et al. |
| 2008/0236746 A1 | 10/2008 | Oyabu et al. |
| 2008/0239691 A1 | 10/2008 | Miyagawa et al. |
| 2009/0294064 A1* | 12/2009 | Nagayama ........ H01J 37/32623 156/345.39 |
| 2011/0247759 A1 | 10/2011 | Kitajima et al. |
| 2015/0118588 A1* | 4/2015 | McLean .............. H01M 8/0656 429/421 |

* cited by examiner

FOCUS RING AND PLASMA PROCESSING APPARATUS

CROSS-REFERENCE TO RELATED APPLICATIONS

This application is a Divisional of U.S. patent application Ser. No. 14/524,049, filed Oct. 27, 2014, and claims priority from Japanese Patent Application No. 2013-222563, filed Oct. 25, 2013, with the Japan Patent Office. The benefit of priority is claimed to each of the foregoing, and the entire contents of each of the foregoing are incorporated herein by reference.

FIELD OF THE INVENTION

Various aspect and embodiments of the present invention relate to a focus ring and a plasma processing apparatus.

BACKGROUND OF THE INVENTION

In a plasma processing apparatus used in a semiconductor device manufacturing process, a substrate to be processed such as a semiconductor wafer or the like is mounted on a substrate mounting table provided in a processing chamber, and a high frequency voltage is applied to the processing chamber under a vacuum environment. Accordingly, a plasma is generated in the processing chamber, and, e.g., etching of the substrate is carried out. In such a plasma processing apparatus, a focus ring is provided at an outer peripheral portion of the substrate mounted on the mounting table to improve in-plane uniformity of the plasma processing of the substrate.

In the above configuration, it is general that a vacuum insulating layer is formed between the focus ring and a top surface of the outer peripheral portion of the mounting table in the depressurized processing chamber and, thus, thermal conductivity between the focus ring and the top surface of the outer peripheral portion of the mounting table becomes considerably poor. When the vacuum insulating layer is formed, it is difficult to cool the focus ring, so that the temperature of the focus ring is increased. As a result, an etching rate and a hole forming property (in which a hole can be reliably formed to a predetermined depth by etching) of the outer peripheral portion of the semiconductor wafer which is close to the focus ring become poorer, and an etching aspect ratio become smaller. In other words, the etching characteristics of the outer peripheral portion of the semiconductor wafer become poorer.

If the plasma processing is continued in the above state, heat is accumulated at the focus ring and, thus, the temperature of the focus ring is not maintained at a constant level. Accordingly, it is difficult to perform uniform etching on a plurality of semiconductor wafers in a same lot.

In order to effectively cool the focus ring, a thermally conductive sheet having good thermal conductivity is inserted between the focus ring and the top surface of the outer peripheral portion of the mounting table. In the case of attaching the thermally conductive sheet, existence of even an extremely small amount of air between the focus ring and the thermally conductive sheet or between the thermally conductive sheet and the portion above the outer peripheral portion of the mounting table leads to insufficient thermal conductivity and insufficient cooling of the focus ring. To that end, an operation of improving the adhesivity of the thermally conductive sheet by repetitively increasing and decreasing a pressure in the chamber or by applying a load by a mechanical pressing unit is carried out when the thermally conductive sheet is attached.

In the plasma processing apparatus including the focus ring, the focus ring is exposed to the plasma and thus is consumed by the etching. As the focus ring is consumed, the in-plane uniformity in the processing of the semiconductor wafer becomes poorer. Therefore, when the focus ring is consumed to a certain extent, the consumed focus ring needs to be exchanged with a new focus ring. However, when the consumed focus ring is detached for exchange from the top surface of the outer peripheral portion of the mounting table, the thermally conductive sheet firmly adhered by the mechanical pressing unit may be broken.

SUMMARY OF THE INVENTION

In view of the above, the present inventors have found that it is difficult to manually adhere a thermally conductive sheet to a focus ring while ensuring adhesivity therebetween and such a problem can be solved by previously firmly fixing the focus ring and the thermally conductive sheet at a factory level, i.e., by firmly adhering the focus ring and the thermally conductive sheet as one unit.

In accordance with present invention, there is provided a focus ring to be detachably attached to a top surface of an outer peripheral portion of a mounting table for mounting thereon a substrate to be processed in a processing chamber, includes: an annular main body having a back surface to be attached to the top surface of the outer peripheral portion of the mounting table; and a thermally conductive sheet fixed to the back surface of the annular main body, the thermally conductive sheet being interposed between the annular main body and the top surface of the outer peripheral portion of the mounting table in the case of attaching the annular main body to the top surface of the outer peripheral portion of the mounting table, wherein the thermally conductive sheet fixed as one unit to the back surface of the annular main body by coating an unvulcanized rubber, a material of which is as same as a material of the thermally conductive sheet, on one surface of the thermally conductive sheet, bringing said one surface into contact with the back surface of the annular main body, and heating the thermally conductive sheet and the annular main body to vulcanize the thermally conductive sheet and to adhere the thermally conductive sheet to the back surface of the annular main body.

With the above configuration, the thermally conductive sheet can be adhered to the focus ring by using the unvulcanized rubber as an adhesive, so that the heat can be sufficiently transferred between the thermally conductive sheet and the focus ring. Accordingly, the focus ring that allows effective heat transfer can be obtained.

In other words, with the above configuration, bubbles are not generated between the thermally conductive sheet and the annular main body. In other words, sufficient thermal conductivity can be ensured without using a conventional mechanical pressing unit.

Other features of the present invention which are not disclosed in claims are disclosed in detailed description of the embodiments and the accompanying drawings so that those skilled in the art can recognize such features.

BRIEF DESCRIPTION OF THE DRAWINGS

The objects and features of the present invention will become apparent from the following description of embodiments, given in conjunction with the accompanying drawings, in which.

DETAILED DESCRIPTION OF THE EMBODIMENTS

The present invention relates to a plasma processing apparatus and a thermally conductive sheet for facilitating thermal conduction which is used for the plasma processing apparatus. First, the plasma processing apparatus used for implementing the present invention will be described.

(Configuration of the Present Embodiment)

Figure 1:
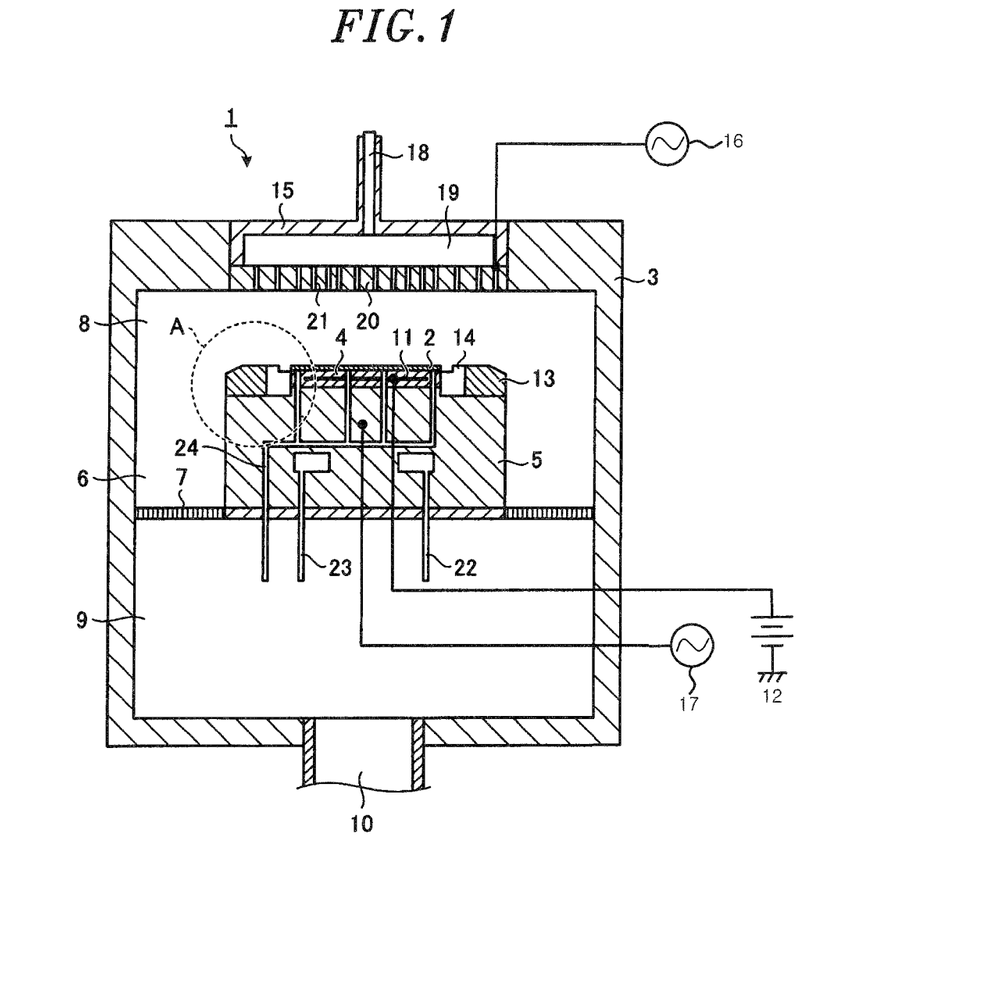
FIG. 1 is a schematic cross sectional view showing an example of a plasma processing apparatus in accordance with an embodiment of the present invention.

FIG. 1 is a schematic cross sectional view showing an example of a plasma processing apparatus used for implementing the present invention. The plasma processing apparatus 1 includes a chamber 3 accommodating a semiconductor wafer 2. As a mounting table for mounting thereon a semiconductor wafer 2, an electrostatic chuck 4 and a cylindrical susceptor 5 are provided in the chamber 3. A side exhaust passageway 6 through which a gas is discharged is formed between an inner wall surface of the chamber 3 and a side surface of the susceptor 5. A gas exhaust plate 7 that is a porous plate is provided in the side exhaust passageway 6. The gas exhaust plate 7 serves as a partitioning plate for partitioning the chamber 3 into an upper and a lower portion. A space above the gas exhaust plate 7 serves as a reaction space 8 and a space below the gas exhaust plate 7 serves as a gas exhaust space 9. In the gas exhaust space 9, a gas exhaust line 10 is opened and the chamber 3 is evacuated by a vacuum pump (not shown). In addition, a ceramic ring or a metal ring may be further provided between the susceptor 5 and a focus ring 14 provided on an outer peripheral portion of the susceptor 5.

The electrostatic chuck 4 having therein an electrostatic electrode plate 11 is provided on the susceptor 5. The electrostatic chuck 4 is formed by embedding the electrostatic electrode plate 11 in a disc-shaped dielectric member (ceramic or the like). By applying a DC high voltage to the electrostatic electrode plate 11 connected to a DC power supply 12, a dielectric potential is generated on a surface of the electrostatic chuck 4. The semiconductor wafer 2 mounted on the electrostatic chuck 4 is attracted and held by Coulomb force or Johnson Rahbek force.

The electrostatic chuck 4 is fixed to the susceptor 5, and the focus ring 14 is disposed between an insulating member 13 and the semiconductor wafer 2. The insulating member 13 prevents excessive spread of the plasma toward the outer periphery. The electric field is controlled to prevent the plasma from excessively spreading and leaking through the gas exhaust plate 7 toward the exhaust side. Further, the surface of the focus ring 14 is made of a conductive material, e.g., silicon, silicon carbide, alumina ceramic, quartz or the like. The focus ring 14 is disposed to surround the outer circumference of the semiconductor wafer 2. The surface of the focus ring 14 is exposed to the reaction space 8. The focus ring 14 has a function of focusing the plasma in the reaction space 8 to the semiconductor wafer 2.

The plasma is generated in the reaction space 8 by the high frequency power applied from the upper high frequency power supply 16 to a gas introduction shower head 15 disposed above the reaction space 8 or by the high frequency power applied from the lower high frequency power supply 17 to the susceptor 5. The upper and the lower high frequency power supply 16 and 17 may supply powers of two or more frequencies. A gas introduction shower head 15 is provided in a celling wall of the chamber 3. The gas introduction shower head 15 holds an upper electrode plate 20 to form a buffer space 19 therebetween. The reactant gas is supplied from the gas inlet line 18 to the gas introduction shower head 15. The reactant gas is turned into a plasma while passing through a plurality of gas holes 21 formed in the upper electrode plate 20 via the buffer space 19 and supplied to the reaction space 8.

The temperature of the semiconductor wafer 2 exposed to the high-temperature plasma is increased. Therefore, the semiconductor wafer 2 is cooled by heat transfer to the susceptor 5. To do so, the susceptor 5 is made of a metal having good thermal conductivity and has therein a coolant path 22. The cooling operation is carried out by circulating in the coolant path 22 a coolant such as water, ethylene glycol or the like supplied from a coolant supply line 23. Further, a plurality of heat transfer gas supply holes 24 is formed at the surface of the electrostatic chuck where the semiconductor wafer 2 is attracted. By circulating helium gas therethrough, the backside of the semiconductor wafer 2 is cooled.

Figure 2:
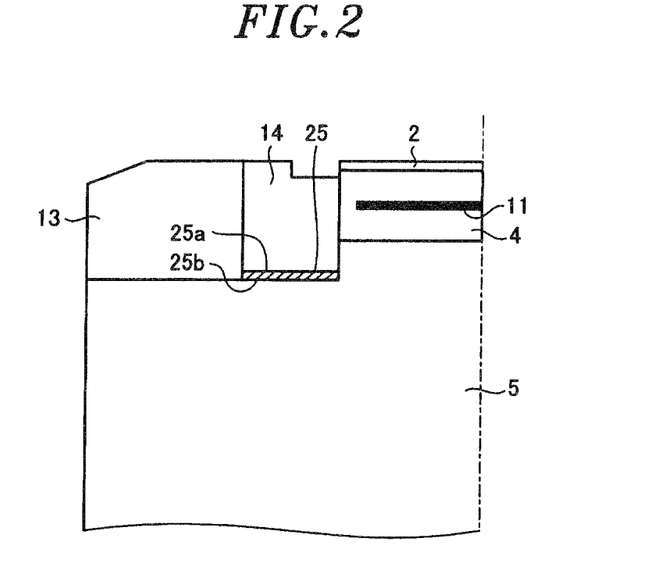
FIG. 2 shows a structure of a focus ring in the plasma processing apparatus.

FIG. 2 is an enlarged view of "A" portion shown in FIG. 1, which specifically shows the focus ring 14 in the apparatus of the present embodiment and an enlarged view. The semiconductor wafer 2 is attracted and held on the electrostatic chuck 4. The electrostatic chuck 4 is fixed to the susceptor 5.

The focus ring 14 has an annular main body made of a dielectric material or a conductive material. The thermally conductive sheet 25 is previously adhered as one unit to the annular main body. The thermally conductive sheet 25 is provided at a contact surface between the focus ring 14 and the susceptor 5 to facilitate thermal conduction therebetween. The thermally conductive sheet 25 is made of polymer (preferably gel-type polymer) having excellent flexibility and thermal conductivity. As described above, the ceramic ring or the metal ring may be further provided between the susceptor 5 and the focus ring 14. In that case, the thermally conductive sheet 25 is provided at a contact surface between the focus ring 14 and the ceramic ring or the metal ring to facilitate thermal conduction therebetween.

As described above, the present invention is characterized in that one surface 25a of the thermally conductive sheet 25 is previously adhered as one unit to the focus ring 14 to prevent decrease in the thermal conduction between the thermally conductive sheet 25 and the focus ring 14.

Figure 3A:
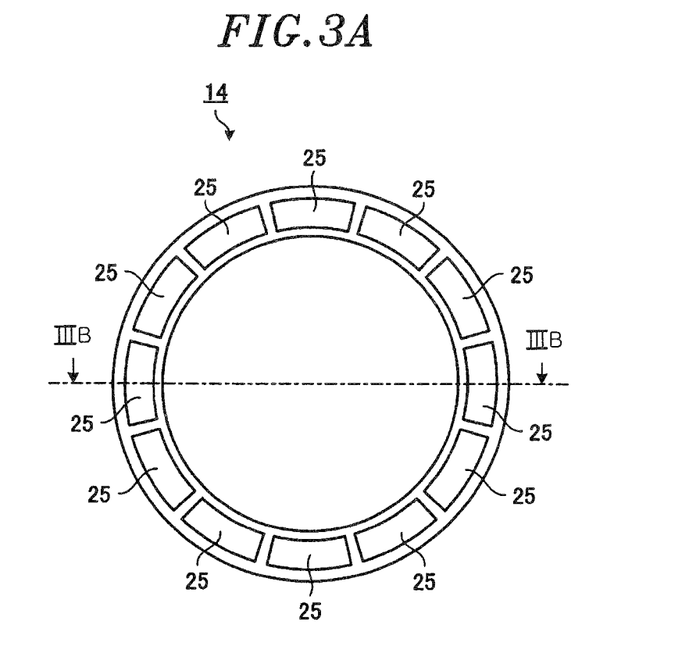
FIGS. 3A and 3B show a structure of a thermally conductive sheet in the embodiment of the present invention.
Figure 3B:
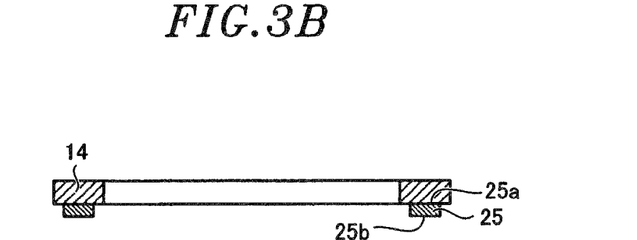

FIGS. 3A and 3B show a structure of the thermally conductive sheet 25 used in the present embodiment. FIG. 3A is a bottom view seen from the bottom side. FIG. 3B is a cross sectional view taken along line IIIB-IIIB in FIG. 3A. The annular main body does not have bolt holes or the like and ensures thermal conductivity without using the mechanical pressing unit.

The thermally conductive sheet 25 is formed by adding, as a filler having a good thermal conductivity, aluminum oxide powder and carbon powder to liquid silicon rubber or liquid fluorine rubber having excellent heat resistance and plasma resistance and then hardening the mixed material. The thermally conductive sheet 25 requires flexibility and thermal conductivity.

Especially, in the configuration of the present invention, appropriate adhesivity of the other surface 25b of the thermally conductive sheet 25 to the susceptor 5 needs to be ensured. Therefore, the thermally conductive sheet 25 needs to have appropriate flexibility. Generally, a thermally conductive sheet having a low hardness has good adhesivity but is disadvantageous in that it is not easily detached. Meanwhile, a thermally conductive sheet having a high hardness is easily detached and handled but is disadvantageous in that it is not easily adhered to the mounting table, which leads to poor thermal conductivity at the interface between the mounting table and the thermally conductive sheets. As a result of various tests on the hardness of the thermally conductive sheet 25, it has been found that good adhesivity is obtained when the hardness indicated by the Shore hardness A is preferably within a range of 10 to 60 and more preferably within a range of 15 to 55.

Figure 5:
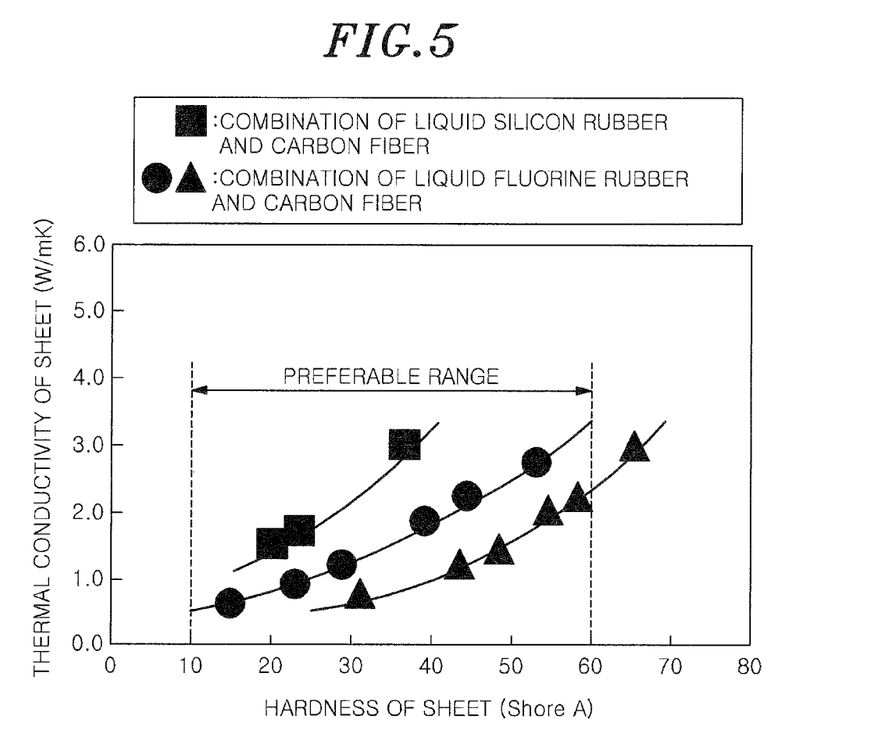
FIG. 5 shows relationship between thermal conductivity and hardness of the thermally conductive sheet in the embodiment of the present invention.

As shown in FIG. 5, the hardness and the thermal conductivity of the thermally conductive sheet have mutual relationship. If a large amount of thermally conductive materials is mixed with liquid rubber in order to form a thermally conductive sheet having good thermal conductivity, the hardened thermally conductive sheet has a high hardness. If a thermally conductive sheet having a low hardness is formed to obtain good adhesivity, the thermal conductivity of the thermally conductive sheet becomes insufficient because it is not possible to mix a large amount of thermally conductive materials.

As a result of tests, it has been found that a composition obtained by mixing carbon fiber having good thermal conductivity with liquid silicon rubber or liquid fluorine rubber has good balance between the hardness and the thermal conductivity.

As for the liquid silicon rubber, it is appropriate to use organopolysiloxane having in a single molecule at least two alkenyl groups bonded to a silicon atom in order to prevent generation of by-products during cross-linking reaction. A molecular structure of organopolysilioxane is not restricted as long as it is in a liquid state. The molecular structure of organopolysilioxane may be, e.g., a straight chain, a branched chain or a partially branched straight chain, but the straight chain is particularly preferable.

The alkenyl group may be, e.g., a vinyl group, an allyl group, a propenyl group, an isopropenyl group or the like which contains 2 to 8 carbon atoms. Among them, it is preferable to use a lower alkenyl group such as the vinyl group, the allyl group or the like. Particularly, it is most preferable to use the vinyl group.

The alkenyl group may be bonded to a silicon atom at an end of a molecular chain or a silicon atom in a molecular chain. However, in order to obtain a cured product having good flexibility, it is preferable that the alkenyl group is bonded only to the silicon atom at the end of the molecular chain.

A group bonded to a silicon atom, other than the alkenyl group, may be an unsubstituted or a substituted monovalent hydrocarbon group having 1 carbon atom, e.g., a methyl group, an ethyl group, a propyl group, an isopropyl group, a butyl group, an isobutyl group, a tertiary butyl group or the like. It may also be a group in which a part or all of hydrogen atoms bonded to the carbon atom of the above group have been substituted with fluorine, chlorine, bromide, a cyano group or the like, e.g., a chloromethyl group, a 2-bromoethyl group, a 3,3,3-trifluoropropyl group, a chlopenyl group, a cyanoethyl group or the like which has 1 to 10 carbon atoms. Among them, it is preferable to use an unsubstituted or a substituted alkyl group having 1 to 3 carbon atoms, such as a methyl group, an ethyl group, a propyl group, a 3,3,3-trifluoropropyl group or the like, and an unsubstituted or a substituted phenyl group such as a phenyl group, a chlorophenyl group, a fluorophenyl group or the like. The groups bonded to a silicon atom, other than the alkenyl group, may be the same group or different groups.

Meanwhile, as for the liquid fluorine rubber, it is preferable to use liquid fluorine rubber having an iodine atom, a bromide atom or the like, or having an alkenyl group with double bonds at an end of a molecular chain or a side chain in view of preventing generation of by-products during cross-linking reaction, as in the case of silicon rubber. A representative fluorine rubber is a copolymer of vinylidene fluoride having iodine or bromide atoms and hexafluoropropylene, a terpolymer of vinylidene fluoride, hexafluoropropylene and tetrafluoroethylene, and a copolymer of tetrafluoroethylene and perfluoro (methylvinylethere). Further, there may be also used a liquid fluorine rubber having a divalent perfluoropolyether structure or a divalent perfluoroalkylene structure and containing at an end of a molecular chain or a side chain at least two alkenyl groups which can undergo addition reaction with a hydrosilyl group in an organic silicon compound.

A viscosity of a mixture is considerably increased by mixing a thermally conductive filler to be described later. However, in consideration of working efficiency during formation of a vulcanized sheet, a viscosity of liquid rubber that is a base polymer is preferably within a range of about 1 to 80 Pa·s (Pascal·sec). Further, the liquid rubber may contain a single component or at least two components having different viscosities.

Although the thermally conductive filler is well-known to those skilled in the art, the thermally conductive filler that can be used in the plasma processing apparatus is restricted. Specifically, it is restricted to aluminum oxide powder, silicon oxide powder, titanium oxide powder, aluminum nitride powder, boron nitride powder, silicon nitride powder, diamond powder, carbon powder, carbon fiber, carbon graphite powder or the like. Since the thermal conductivity can be effectively improved with a small amount of carbon powder, the carbon power is preferably used.

In view of improvement of the thermal conductivity, carbon fiber having an average fiber diameter of 5 to 20 µm and an average fiber length of 20 to 300 µm is preferably used. Particularly, carbon fiber having an average fiber diameter of 5 to 15 µm and an average fiber length of 30 to 200 µm is more preferably used.

The addition amount of carbon fiber is preferably within a range of 20 parts by weight to 200 parts by weight with respect to that of organopolysiloxane or liquid fluorine rubber. When the addition amount of carbon fiber is 20 parts by weight or less, a desired thermally conductive sheet cannot be obtained. When the addition amount of carbon fiber is 200 parts by weight or above, the thermally conductive sheet 25 formed by heating has a high hardness and the adhesivity of the thermally conductive sheet 25 to the mounting table becomes poor, which is not preferable in view of effective heat transfer at the interface between the mounting table and the thermally conductive sheet 25.

In the present embodiment, in order to obtain a thermally conductive sheet 25 having a desired thermal conductivity, a conventional additive or filler may be added to the aforementioned composition within a range that does not affect the required features. Specifically, a viscosity adjuster such as silicon oil, fluorine oil or the like, or an agent for imparting flame-retardant properties such as metal oxide, metal hydroxide or the like may be added.

A thermally conductive sheet preferably has a thickness of 0.1 mm to 1.0 mm and more preferably has a thickness of 0.2 mm to 0.5 mm. A thermally conductive sheet having a thickness smaller than 0.1 mm has a low strength, so that it is not easily handled and has poor adhesivity. Meanwhile, if the thickness of the thermally conductive sheet is greater than 1 mm, the heat resistance is increased, which makes it difficult to obtain desired thermal conductivity.

The thermal conductivity of the thermally conductive sheet is increased in direct proportion to the addition amount of carbon fiber. The thermal conductivity of the thermally conductive sheet 25 is preferably 0.8 W/m·K or above and more preferably 1.0 W/m·K or above.

The thermally conductive sheet 25 thus formed is cut in a partial arc shape shown in FIG. 3A so as to be fixed to the back surface of the focus ring 14. In the present embodiment, the thermally conductive sheet 25 is divided into 12 parts in a circumferential direction and a small gap is ensured between the adjacent thermally conductive sheets. The thermally conductive sheet 25 is adhered as one unit to one surface of the focus ring 14 by the following process.

The shape of the thermally conductive sheet 25 is not limited and may vary as long as it can cover one surface of the focus ring 14 and ensure high working efficiency.

(Process of Adhering the Thermally Conductive Sheet 25 and the Focus Ring 14 as One Unit)

Figure 4:
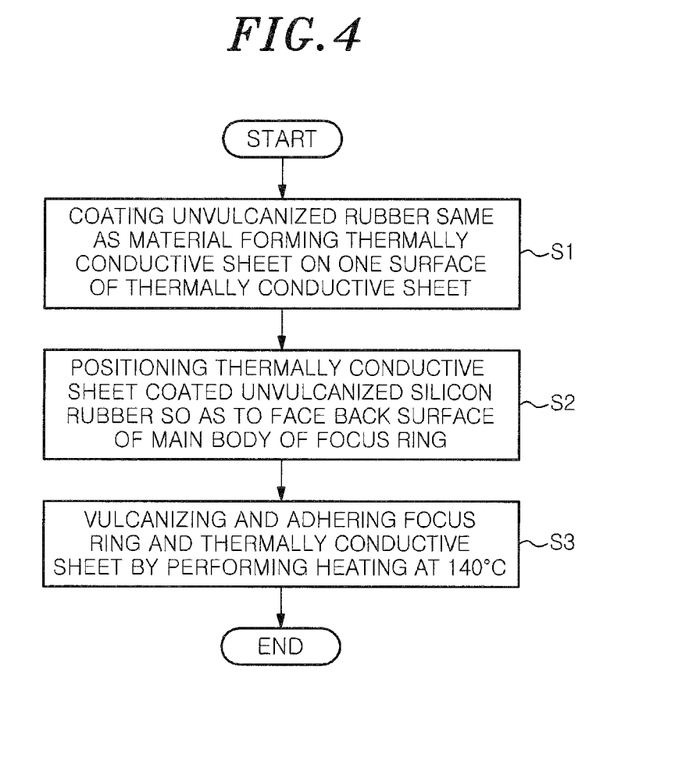
FIG. 4 shows a method of adhering the focus ring and the thermally conductive sheet as one unit in the embodiment of the present invention.

Hereinafter, the process of adhering the thermally conductive sheet 25 and the focus ring 14 as one unit will be described with reference to FIG. 4.

As described above, the present inventors have found, as a result of study to achieve the above object, that it is optimal to perform heating for vulcanizing and adhering the thermally conductive sheet 25 to the focus ring 14 at a factory level while using as an adhesive an unvulcanized rubber same as the material of the thermally conductive sheet 25. In other words, if the thermally conductive sheet 25 is made of silicon rubber, an unvulcanized rubber made of silicon rubber is used as an adhesive. If the thermally conductive sheet 25 is made of fluorine rubber, an unvulcanized rubber made of fluorine rubber is used as an adhesive.

First, in a step S1, an unvulcanized liquid silicon rubber (or liquid fluorine rubber) composition is coated on one surface of the thermally conductive sheet 25 formed in the above manner. In other words, in the present embodiment, the unvulcanized liquid silicon rubber (or liquid fluorine rubber) composition used for forming the thermally conductive sheet 25 is used as an adhesive. Such a composition can be vulcanized and adhered to the focus ring 14 and thus is used as an adhesive.

Next, in a step S2, the thermally conductive sheet 25 is adhered to the focus ring 14 in a state where the surface of the thermally conductive sheet 25 where the unvulcanized silicon rubber composition is coated is positioned so as to face the back surface of the main body of the focus ring 14. This step may be performed manually or mechanically.

After the thermally conductive sheet 25 is positioned and adhered to the focus ring 14, in a step S3, the focus ring 14 and the thermally conductive sheet 25 are vulcanized and adhered by performing heating at 100° C. to 150° C. (130° C. to 170° C. in the case of liquid fluorine rubber), and preferably at 130° C. to 140° C. (140° C. to 160° C. in the case of liquid fluorine rubber). The sufficiently firm adhesion can be obtained by performing heating at such a temperature for 30 to 60 minutes. Under such conditions, desired properties (flexibility, viscosity and thermal conductivity) can be maintained without decomposing the thermally conductive sheet 25.

As a result of the above process, the focus ring 14 to which the thermally conductive sheet 25 has been adhered as one unit can be obtained.

With the above configuration, the following effects can be obtained.

1. The focus ring 14 to which the thermally conductive sheet 25 has been previously adhered as one unit can be obtained by performing heating for vulcanizing and adhering the thermally conductive sheet 25 to the focus ring 14 while using as an adhesive an unvulcanized rubber same as the material of the thermally conductive sheet 25. Accordingly, it is possible to prevent decrease in the thermal conductivity at the interface between the thermally conductive sheet 25 and the focus ring 14.

2. The step of performing heating for vulcanizing and adhering the thermally conductive sheet 25 to the focus ring does not affect characteristics of the thermally conductive sheet 25. Therefore, desired flexibility and adhesivity can be ensured at the other surface of the thermally conductive sheet 25. Accordingly, the thermal conductivity can be sufficiently obtained at the interface between the thermally conductive sheet 25 and the top surface of the outer peripheral portion of the mounting table.

3. Due to the above effects 1 and 2, the heat can be sufficiently transferred between the focus ring 14 and the top surface of the outer peripheral portion of the mounting table even under the chamber environment where heat is hardly transferred due to vacuum insulation. Therefore, the focus ring 14, which can be controlled to a desired temperature, can be obtained without using a conventional mechanical pressing unit.

4. In accordance with the plasma processing apparatus 1 that uses the focus ring 14 and does not have a mechanical pressing unit, it is unnecessary to firmly press the focus ring 14 toward the chamber, so that desired detachability can be ensured at the other surface of the thermally conductive sheet 25. As a result, poor detachability or remnants generated by forcible peeling can be avoided.

5. The present invention is not limited to the above embodiment and may be variously modified without departing from the scope of the present invention.

In the above, the thermally conductive sheet 25 is divided into 12 parts in the circumferential direction. However, the thermally conductive sheet 25 may be divided into 6 parts, for example. Further, a required temperature of the focus ring can be obtained by changing the area or the divided number of the thermally conductive sheet.

While the invention has been shown and described with respect to the embodiments, it will be understood by those skilled in the art that various changes and modifications may be made without departing from the scope of the invention as defined in the following claims.

What is claimed is:

1. A method for manufacturing a focus ring to be detachably attached to a top surface of an outer peripheral portion of a mounting table for mounting thereon a substrate to be processed in a processing chamber, the method comprising:
    preparing an annular main body having a back surface to be attached to the top surface of the outer peripheral portion of the mounting table; and
    fixing a thermally conductive sheet to the back surface of the annular main body by coating an unvulcanized rubber, a material of which is the same as a material of the thermally conductive sheet, on one surface of the thermally conductive sheet, bringing said one surface into contact with the back surface of the annular main body, and heating the thermally conductive sheet and the annular main body to vulcanize the thermally conductive sheet and to adhere the thermally conductive sheet to the back surface of the annular main body, wherein the thermally conductive sheet is formed in a sheet form by vulcanizing and hardening an unvulcanized rubber obtained by adding carbon fiber as a filler for ensuring thermal conductivity to liquid fluorine rubber, and the heating is performed at 130° C. to 170° C. at which the flexibility and the thermal conductivity of the thermally conductive sheet are not changed.

* * * * *